(12) United States Patent
Horng et al.

(10) Patent No.: US 9,219,038 B2
(45) Date of Patent: Dec. 22, 2015

(54) SHIELDING FOR THROUGH-SILICON-VIA

(71) Applicant: Taiwan Semiconductor Manufacturing Co. Ltd., Hsin-Chu (TW)

(72) Inventors: Jaw-Juinn Horng, Hsinchu (TW); Chung-Peng Hsieh, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 84 days.

(21) Appl. No.: 13/795,035

(22) Filed: Mar. 12, 2013

(65) Prior Publication Data

US 2014/0264772 A1  Sep. 18, 2014

(51) Int. Cl.
| | | |
|---|---|---|
| *H01L 29/40* | (2006.01) | |
| *H01L 23/552* | (2006.01) | |
| *H01L 23/48* | (2006.01) | |
| *H01L 23/58* | (2006.01) | |
| *H01L 25/065* | (2006.01) | |

(52) U.S. Cl.
CPC ............ *H01L 23/552* (2013.01); *H01L 23/481* (2013.01); *H01L 23/585* (2013.01); *H01L 25/0657* (2013.01); *H01L 2225/06513* (2013.01); *H01L 2225/06544* (2013.01); *H01L 2924/0002* (2013.01)

(58) Field of Classification Search
CPC . H01L 23/552; H01L 23/585; H01L 25/0657; H01L 23/481; H01L 2225/06513; H01L 2225/06541; H01L 2225/06544; H01L 2924/0002
See application file for complete search history.

(56) References Cited

U.S. PATENT DOCUMENTS

| | | | |
|---|---|---|---|
| 7,541,652 B1* | 6/2009 | Abughazaleh | 257/372 |
| 2010/0148267 A1* | 6/2010 | Arai et al. | 257/355 |
| 2010/0237386 A1* | 9/2010 | Lin et al. | 257/173 |
| 2011/0042714 A1* | 2/2011 | Ogura | 257/139 |

OTHER PUBLICATIONS

Jonghyun Cho, et al.; "Through Silicon Via (TSV) Shielding Structures"; 2010 IEEE, p. 269-272.
Roshan Weerasekera, et al.; "On Signalling Over Through-Silicon Via (TSV) Interconnects in 3-D Integrated Circuits"; Design Automation and Test in Europe Conference and Exhibit; Mar. 8-12, 2010; Conference Publications, p. 1325-1328.

* cited by examiner

*Primary Examiner* — Su C Kim
(74) *Attorney, Agent, or Firm* — Eschweiler & Associates, LLC

(57) ABSTRACT

3D integrated circuit devices include first and second semiconductor bodies. The first semiconductor body has an active area, a through-silicon-via outside the active area, and two or more disjoint guard rings. The first guard ring encircles the via. The second guard ring encircles the active area, but not the via. The guard rings can reduce the noise coupling coefficient between the via and the active area to −60 dB or less at 3 GHz and 20 μm spacing.

22 Claims, 5 Drawing Sheets

SHIELDING FOR THROUGH-SILICON-VIA

FIELD

The present disclosure relates generally to integrated circuit devices and more particularly to shielding for through-silicon-vias.

BACKGROUND

Since the invention of the integrated circuit, the semiconductor industry has continuously sought to improve the density of integrated circuit components (transistors, diodes, resistors, capacitors, etc.). For the most part, improvements in density have come from reductions in feature size, allowing more components to be formed within a given area. These improvements have been made while components remain in an essentially two-dimensional layout. Although dramatic increases in density have been realized within the limits of a two-dimensional layout, further improvements are difficult to achieve.

Three-dimensional integrated circuits (3D ICs) have been created to overcome these limitations. In a 3D IC, two or more semiconductor bodies, each including an integrated circuit, are formed, aligned vertically, and bonded together. Circuits on different semiconductor bodies are connected at least in part through conductive vias penetrating the full thickness of at least one of the semiconductor bodies. These are described as through-silicon-vias (TSV) regardless of whether the semiconductor body is silicon.

DETAILED DESCRIPTION

Signals carried by the TSVs can cause noise in adjacent active circuits. Shielding has been provided to reduce this noise. One type of shielding is a guard ring of doped semiconductor formed around the TSVs. The doping can be of the p+ type or of the deep n-well (DNW) type. A difficulty with this approach is that the shielding exists only near the surface of the semiconductor body. The TSV signal noise may remain coupled to the active circuit through the deeper parts of the semiconductor body. This type of shielding is largely ineffective against high frequency noise. Another approach is to form one or more shielding TSVs between the signal TSV and the active circuit. This approach is more effective than guard rings around the TSVs, although still less effective than the approach provided by the present disclosure.

The present disclosure, in some embodiments, provides 3D integrated circuit devices including first and second semiconductor bodies. The first semiconductor body has an active area, a through-silicon-via outside the active area, and two or more disjoint guard rings. The guard rings are contiguous regions of p+ doped semiconductor. In most embodiments, p+ means having p-type dopants at a concentration greater than a p type region, and in one embodiment may comprise a concentration of at least $5.0 \times 10^{18}$ atoms/cm$^3$. The first guard ring encircles the via. The second guard ring encircles the active area, but not the via. In some embodiments, the guard rings reduce the noise coupling coefficient between the via and the active area to −60 dB or less at 3 GHz and 50 μm spacing.

In an embodiment, the first guard ring also encircles the second guard ring. In another embodiment the first guard ring encircles the second guard ring and includes an extension that divides the space between the via and the active area. In another embodiment, a portion of the first guard ring divides the space between the via and the active area and is thicker between the via and the active area.

The present disclosure, in some embodiments, provides a method of shielding to prevent signals carried by a through-silicon-via from causing undesirably high noise in an active area of an integrated circuit. The method includes forming a first p+ guard ring around the through-silicon-via and forming a second p+ guard ring around the active area. The first and second guard rings are grounded in an embodiment.

Figure 1:
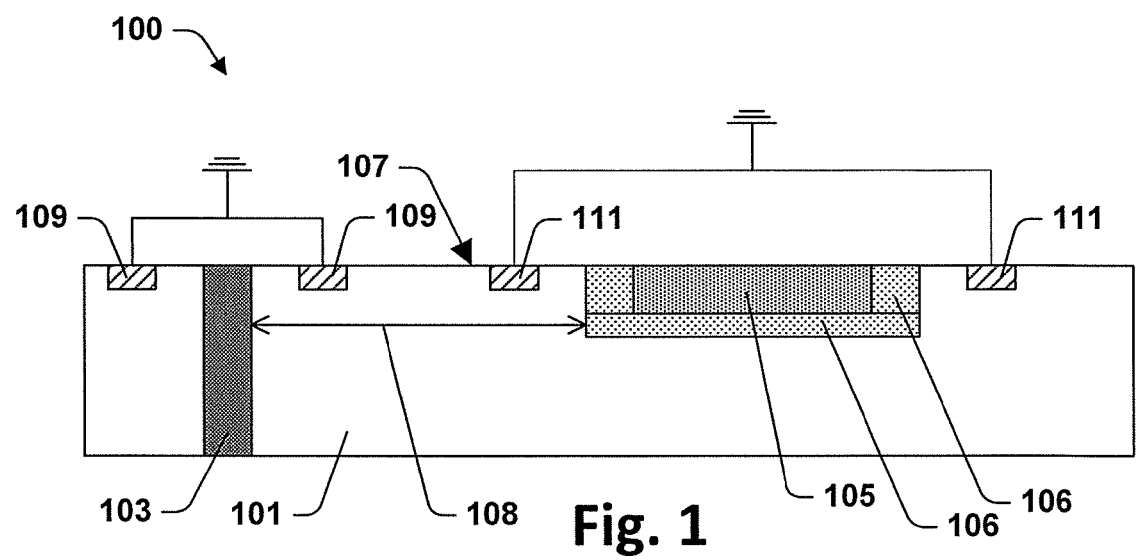
FIG. 1 is a schematic illustration of an example embodiment of a 3D-IC according to the present disclosure viewed in cross-section.
Figure 2:
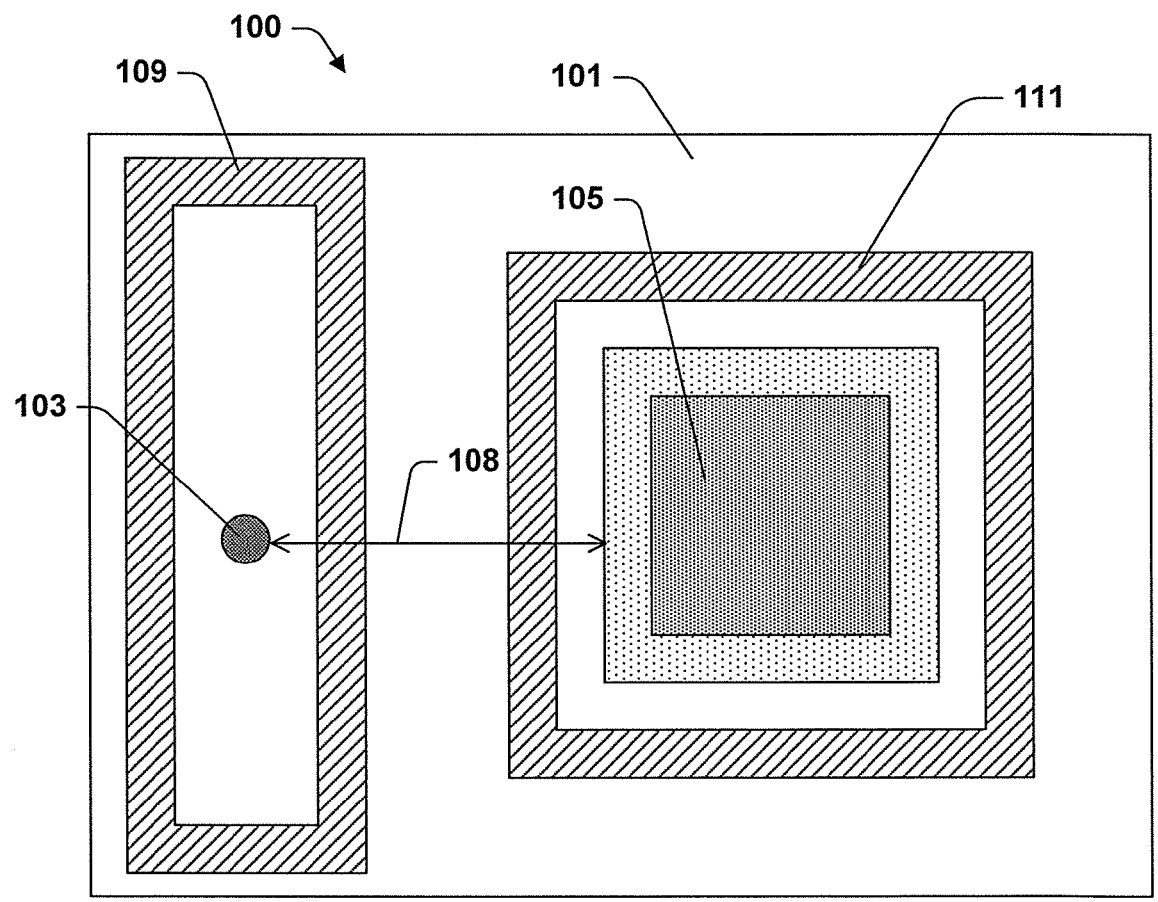
FIG. 2 is a schematic illustration of the embodiment of FIG. 1 in plan view.

FIG. 1 is an example embodiment of a 3-D IC device 100 provided by the present disclosure. FIG. 2 is a plan view of the same device 100. Only a portion of the device 100 is illustrated in the figures. The device 100 includes a semiconductor body 101. A through-silicon-via (TSV) 103 penetrates the semiconductor body 101. An active area 105 is formed on the surface 107 of the semiconductor body 101 and includes an n-well 106. In some embodiments, the n-well 106 is included. In other embodiments, the n-well 106 is not included. The TSV 103 is outside the active area 105. The distance 108 between the TSV 103 and the active area 105 is generally in the range from 10 μm to 50 μm. Some separation is used to keep noise coupling within acceptable limits regardless of what shielding is used. On the other hand, it is desirable to limit the amount of separation in order to avoid wasting chip area. In some other approaches, using shielding, a minimum separation of 50 μm was generally required. In some embodiments of the present disclosure, the distance 108 is 35 μm or less. In some other embodiments, the distance 108 is 20 μm or less.

As shown in FIG. 2, a first guard ring 109 encircles the TSV 103. A second guard ring 111 encircles the active area 105. Guard rings 109 and 111 are generally formed by ion implantation and exist in a zone of the semiconductor body 101 proximate the surface 107. Encircling is used in the sense of surrounding. To encircle means to form a boundary on all sides of an element of interest in at least one plane parallel the surface 107. While a rectangle is shown in FIG. 2, other shapes that surround the TSV 103 or the active area 105 may be employed in various other embodiments.

The semiconductor body 101 includes a semiconductor. The semiconductor can be in crystal or polycrystalline form. The semiconductor can be an elementary semiconductor such as silicon or germanium, or a compound semiconductor such as SiGe, GaAs, or InP. The semiconductor composition can vary with position as in a continuously varying ratio of Si to Ge in a SiGe semiconductor. The semiconductor can have a multilayer structure. The semiconductor can be lightly doped.

The active area 105 includes one or more active or passive devices. In some embodiments, the active area 105 includes one or more devices such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, FinFET transistors, and/or other types of transistors. In some embodiments, the active area 105 includes passive microelectronic devices. The active area 105 generally includes a plurality of devices and is generally at least 100 µm² and is typically at least 500 µm² in some embodiments, but may vary in other embodiments.

Guard rings 109 and 111 are heavily doped regions of the semiconductor body 101, contiguous within themselves but disjoint from one-another. The first guard ring 109 reduces noise coupling between the via 103 and the active area 105, particularly at low frequencies, for example, frequencies below 1 GHz. However, most of the reduction in noise coupling for high frequencies (e.g., frequencies greater than 1 GHz, and more particularly frequencies greater than 2 GHz) is due to the guard ring 111. This is in part because while the guard rings 109 and 111 have depths generally in the range from 0.1 µm to 5 µm, and typically in the range from 0.2 µm to 1.0 µm, e.g., 0.5 µm. TSV 103, on the other hand, generally has a height that is at least 10 times greater. The height of TSV 103 is generally in the range from 20 µm to 100 µm, and is typically in the range from 30 µm to 70 µm. The second guard ring 111, the one surrounding the active area 105, compliments the first guard ring 109 by significantly reducing the noise coupling from via 103 that can otherwise occur from the via 103 through deeper in the semiconductor body 101.

Figure 3:
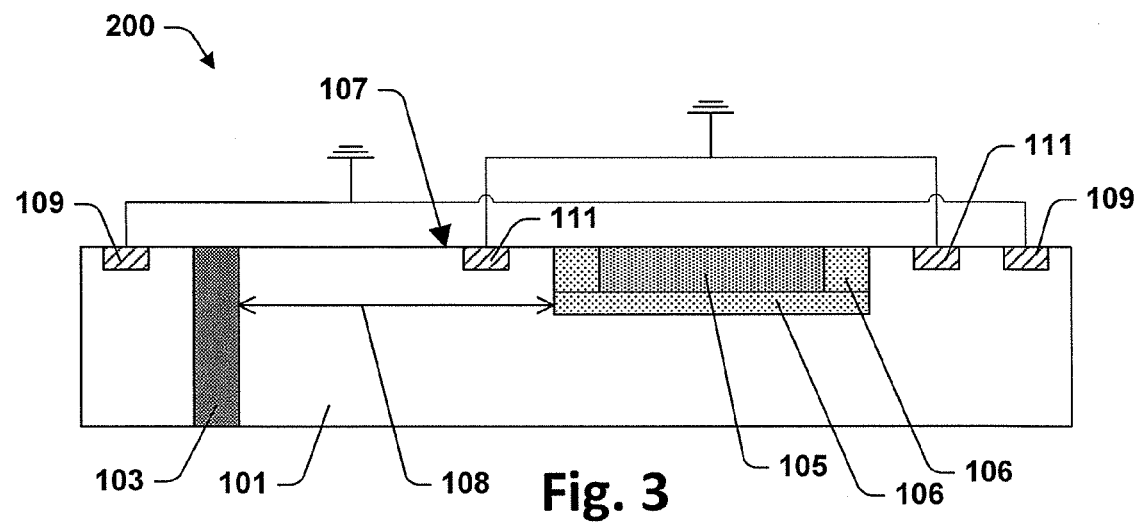
FIG. 3 is a schematic illustration of another example embodiment of a 3D-IC according to the present disclosure viewed in cross-section.
Figure 4:
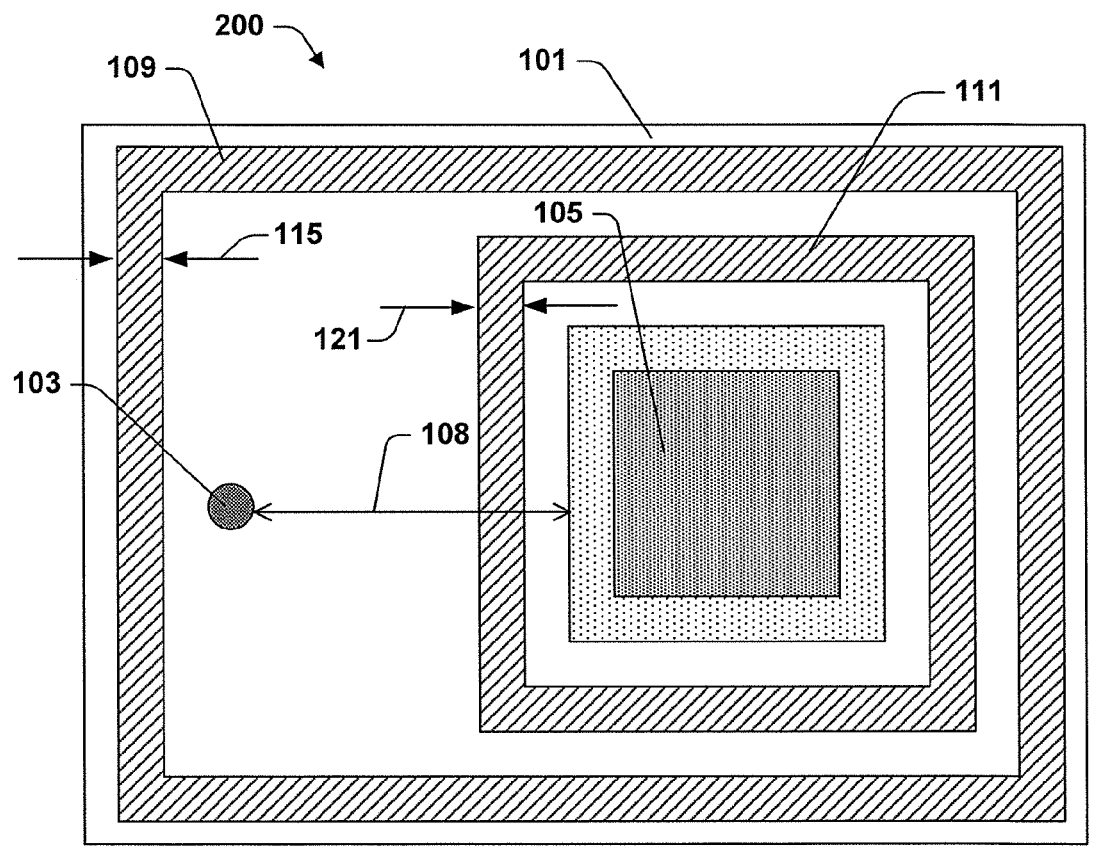
FIG. 4 is a schematic illustration of the embodiment of FIG. 3 in plan view.

Noise coupling through deeper portions of the semiconductor body 101 is further reduced in some embodiments by having the first guard ring 109 extend to surround the second guard ring 111 and therefore the active area 105. The device 200 illustrated by FIGS. 3-4 provides an example of such embodiments.

Figure 5:
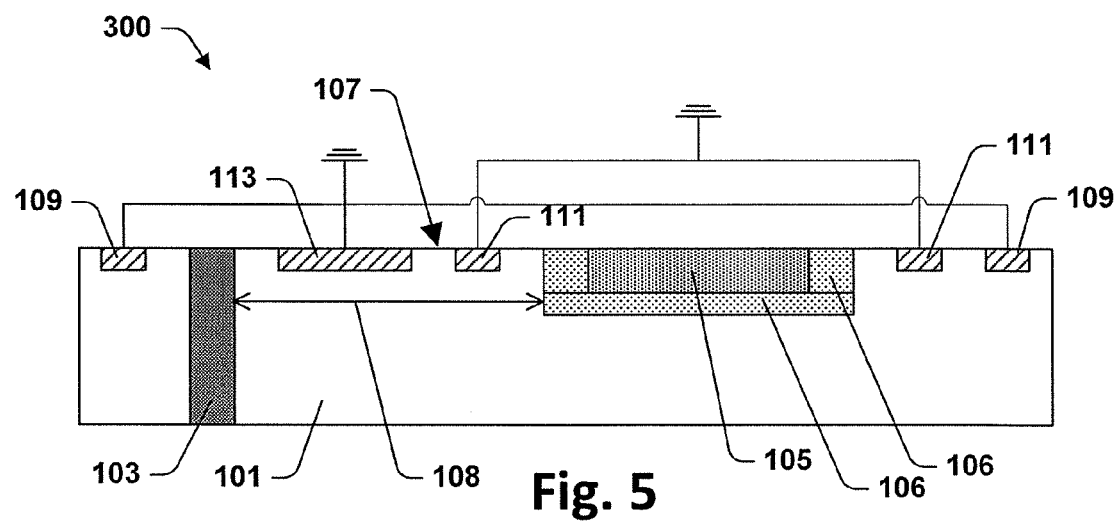
FIG. 5 is a schematic illustration of another example embodiment of a 3D-IC according to the present disclosure viewed in cross-section.
Figure 6:
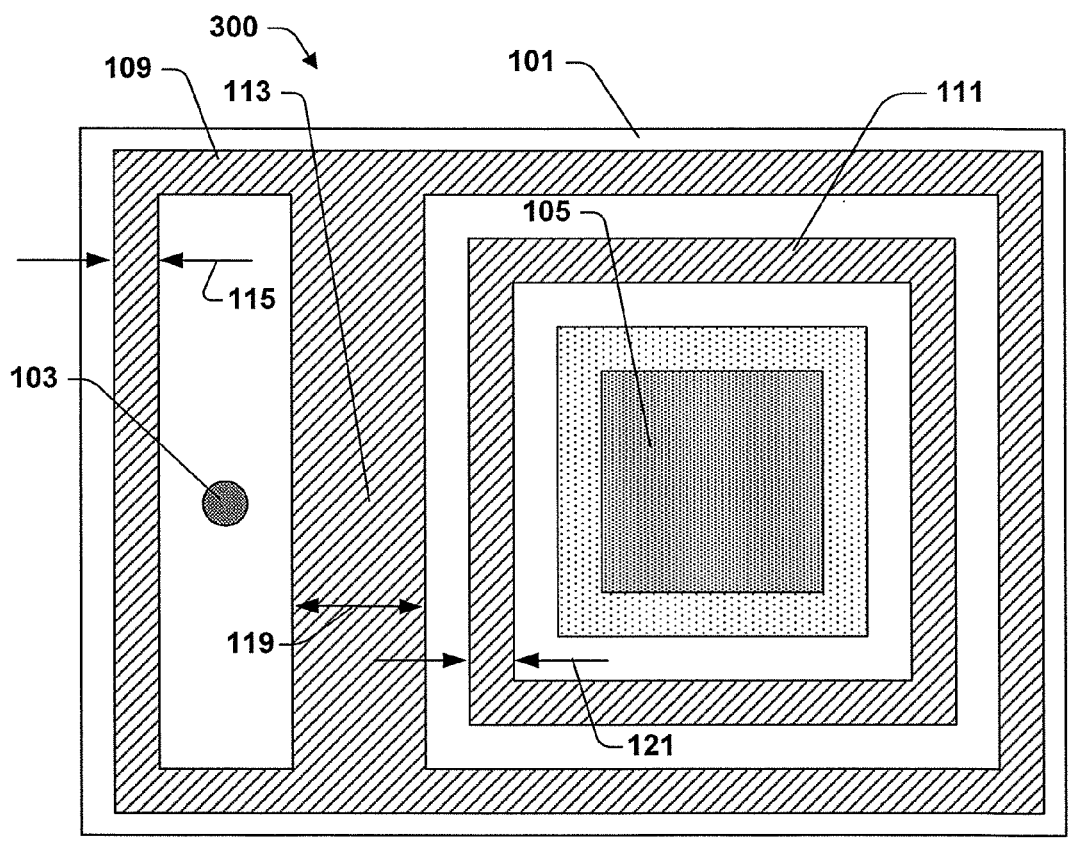
FIG. 6 is a schematic illustration of the embodiment of FIG. 5 in plan view.

Noise coupling is a function of the distance 108 between the via 103 and the active area 105. Noise coupling in the device 100 can be reduced by widening either the first guard ring 109 or the second guard ring 111 in the space between the via 103 and the active area 105. In some embodiments, the first guard ring 109 is the one widened The device 200 of FIGS. 3 and 4 differs from the device 100 of FIGS. 1 and 2 in that the first guard ring 109 does not include a portion 109 extending through the space between the via 103 and the active area 105. The shielding in device 200 can be improved by adding to the first guard ring 109 an extension 113 that divides the space between the via 103 and the active area 105. The 3D IC device 300 illustrated by FIGS. 5-6 is an example of embodiments employing this feature. The extension 113, as illustrated in FIGS. 5 and 6, can be wider than other portions of the guard ring 109.

In FIGS. 3-6, the width 115 of the guard ring 109 and the width 121 of the guard ring 111 are each generally from 0.10 µm to 0.25 µm. In some embodiments, at least one of the guard rings 109 and 111 is wider where it lies between the via 103 and the active area 105 as shown for the example 3D IC device 300 in FIGS. 5 and 6. In some embodiments, for example, as illustrated in FIGS. 5-6, the sum of the widths 119 and 121 of the guard rings 109 and 111 between the via 103 and the active area 105 is at least 0.25 µm. In some embodiments, the width 119 of the guard ring 109 alone is at least 0.25 µm where it runs between the via 103 and the active area 105. In some embodiments, the width 119 of the guard ring 109 where it lies between the via 103 and the active area 105 is at least 50% wider than the width 115 of the guard ring 109 elsewhere. In some embodiments, for example, as illustrated in FIGS. 5-6, the guard ring 109 includes an extension 113 that is wider than other portions of the guard ring 109 as shown in FIGS. 5 and 6. In some embodiments, the width 119 of the guard ring extension 113 of the guard ring 109 is at least 0.25 µm wide.

The guard rings 109 and 111 are both grounded in an embodiment. In some embodiments, each of the guard rings 109 and 111 is coupled to distinct ground pads. In some other embodiments, the guard rings 109 and 111 are coupled to a common ground pad. In operation, the guard ring 109 registers noise as a result of signals through the via 103. Noise within the guard ring 109 generally does not propagate significantly to the guard ring 111. The guard ring 111 also registers noise as a result of signals through the via 103, but to a lesser extent than the guard ring 109. The guard ring 111 therefore generally remains closer to the ground voltage as compared to the guard ring 109. The guard ring 109 thus operates as a first ground whereas the guard ring 111 is a second ground, wherein the second ground exhibits less noise than the first ground.

Figure 7:
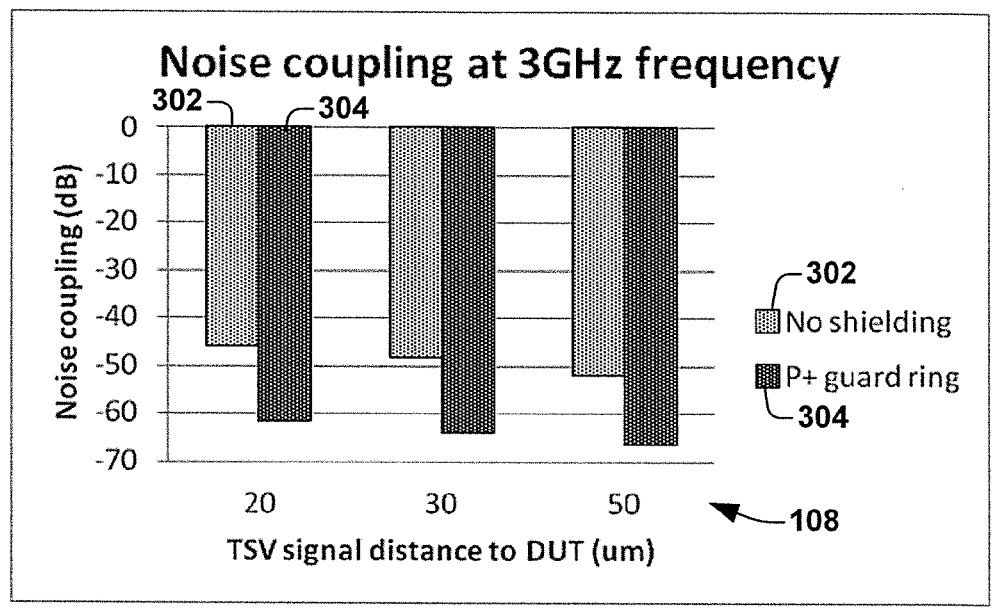
FIG. 7 is a chart showing the reduction in noise coupling coefficient provided by an embodiment of the present disclosure for various TSV to DUT distances.
Figure 8:
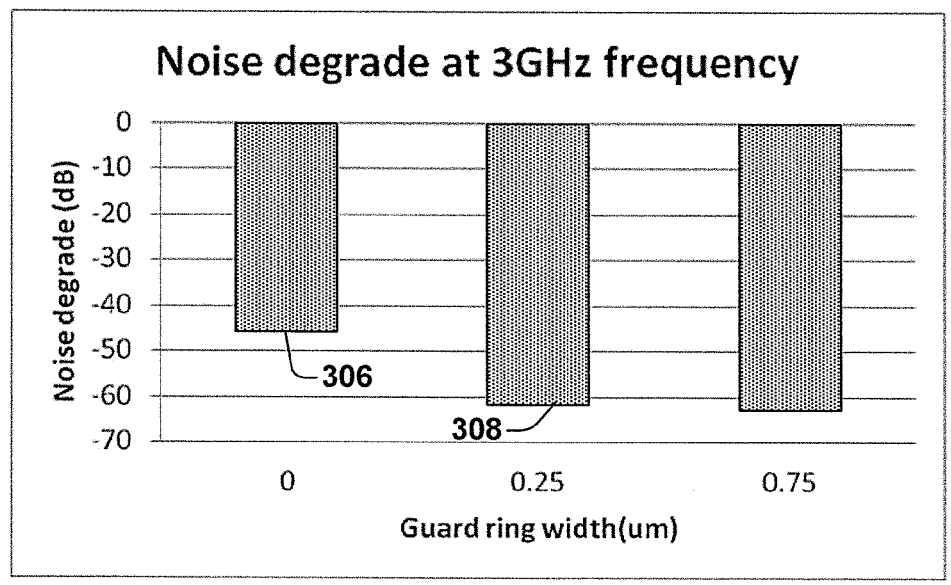
FIG. 8 is a chart showing the reduction in noise coupling coefficient provided by an embodiment of the present disclosure for various guard ring widths.

A guard ring around the via 103 by itself in other approaches provides comparatively little reduction in high frequency noise coupling. The noise coupling coefficients between the via 103 and the active area 105 in other approaches are −50 dB or greater at 3 GHz circuit operating frequency absent the shielding provided by the present disclosure. Unless otherwise stated, these and other noise coupling coefficients reported in this disclosure are for TSVs 10 µm in diameter including an 0.5 µm isolation layer, a TSV height of 50 µm, and a spacing of 40 µm. FIGS. 7 and 8 show that the noise coupling coefficients at 3 GHz can be reduced to −60 GHz or less using the structures provided by the present disclosure. FIG. 7 compares the noise coupling coefficient at 3 GHz circuit operating frequency without shielding (light bars) 302 to the noise coupling coefficient at 3 GHz circuit operating frequency with shielding (i.e., p+ guard ring) 304 according to the present disclosure. In an embodiment, the 3 GHz circuit operating frequency corresponds to a frequency of signals passing through the through silicon via (TSV) 103, however, it may also correspond to a frequency of circuitry within the active area 105. Results are shown for three different distances (20 µm, 30 µm, and 50 µm) 108 between the TSV 103 and the active area 105. Without shielding 302, the noise coupling coefficient is greater than −60 dB for all cases and is greater than −50 db if the distance 108 is less than 50 µm. With shielding 304 according to the present disclosure, the noise coupling coefficient is less than −60 db even if the distance 108 is as small as 20 µm (see FIG. 5). FIG. 8 compares the noise coupling coefficient for various widths 119 of the guard ring 109 (see FIG. 6) between the TSV 103 and the active area 105. For the case in which the width is zero at 306, there is no shielding (no p+ guard ring). For the widths of 0.25 µm and 0.75 µm, the shielding (111 (FIG. 3-4) or 109/111 (FIGS. 5-6)) is provided as described in the present disclosure. The data shows that a 0.25 µm width at 308 is sufficient to reduce the noise coupling to below −60 dB.

Figure 9:
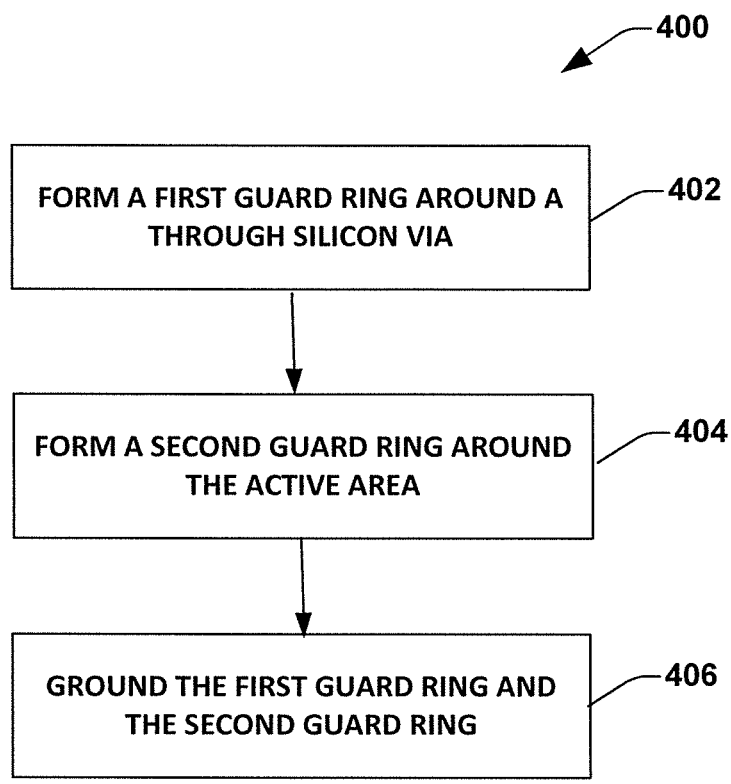
FIG. 9 is a flow chart illustrating a method of shielding to prevent signals carried by a through silicon via from causing noise in an active area of an integrated circuit provided by an embodiment of the present disclosure.

A method of shielding to prevent signals carried by a through silicon via from causing noise in an active area of an integrated circuit is illustrated in FIG. 9, as designated at reference numeral 400. The method 400 comprises forming a first guard ring, for example, a heavily doped p+ guard ring around a silicon through via at 402, and forming a second guard ring, for example, a heavily doped p+ guard ring around an active area containing circuitry therein at 404. The first and second guard rings are then grounded by electrically coupling such guard rings to a ground potential node at 406. In an embodiment the first guard ring operates as a first ground having a first noise characteristic, and the second guard ring operates as a second ground having a second noise characteristic, wherein the first noise characteristic is larger than the second noise characteristic. Nevertheless, the guard rings operate to reduce the noise coupling coefficient between the silicon through via and the active area, for example, to −60 dB or less in an embodiment.

The following claims are directed to 3D integrated circuit devices and related methods. The devices include a semiconductor having an active area and a through silicon via. A first guard ring surrounds the TSV and a second guard ring surrounds the active area. In some embodiments, the first guard ring also encircles or otherwise surround the second guard ring. In some embodiments, the first guard ring includes an extension that divides the space between the via and the active area. In some embodiments, this extension is thicker than other portions of the guard ring. The claims are also directed to methods of shielding TSVs using any of these structures.

An integrated circuit device comprises a semiconductor body, an active area of the body and a via penetrating through the semiconductor body, wherein the via is outside the active area. A first contiguous region is provided throughout which the semiconductor body is p-doped to a concentration of at least $5.0 \times 10^{18}$ atoms/cm$^3$, wherein the first region encircles the active area, but not the via, and a second contiguous region is provided throughout which the semiconductor body is p-doped to a concentration of at least $5.0 \times 10^{18}$ atoms/cm$^3$, wherein the second region encircles the via, and the second region is disjoint from the first region. The semiconductor body is not p-doped or is p-doped to a concentration less than $5.0 \times 10^{18}$ atoms/cm$^3$ where the semiconductor body borders either the first or second contiguous region.

A 3D integrated circuit device comprises first and second semiconductor bodies, an active area of the first semiconductor body, and a via penetrating through the first semiconductor body, wherein the via is outside the active area and forms a connection with a circuit formed in the second semiconductor body. A first contiguous region is provided throughout which the first semiconductor body is doped p+, wherein the first region encircles the active area, but not the via, and a second contiguous region is provided throughout which the first semiconductor body is doped p+, wherein the second region encircles the via. The second region is disjoint from the first region, and the semiconductor body is not p-doped or is p-doped to a concentration less than $5.0 \times 10^{18}$ atoms/cm$^3$ where the semiconductor body borders either the first or second contiguous region.

A method of shielding to prevent signals carried by a through-silicon-via from causing noise in an active area of an integrated circuit comprises forming a first p+ guard ring around the through silicon via, forming a second p+ guard ring around the active area, and grounding the first and second guard rings.

The components and features of the present disclosure have been shown and/or described in terms of certain embodiments and examples. While a particular component or feature, or a broad or narrow formulation of that component or feature, may have been described in relation to only one embodiment or one example, all components and features in either their broad or narrow formulations may be combined with other components or features to the extent such combinations would be recognized as logical by one of ordinary skill in the art.

The invention claimed is:

1. An integrated circuit device, comprising:
    a semiconductor body;
    an active area of the semiconductor body;
    a via penetrating through the semiconductor body without passing through the active area;
    a first contiguous region throughout which the semiconductor body is p-doped to at least a first concentration, the first contiguous region surrounding an area of the semiconductor body comprising the active area; and
    a second contiguous region throughout which the semiconductor body is p-doped to at least the first concentration, the second contiguous region surrounding the via, the second region being disjoint from the first contiguous region;
    wherein the second contiguous region fully surrounds the first contiguous region, the semiconductor body is not p-doped or is p-doped to a second concentration that is less than the first concentration, and the via is outside the area surrounded by the first contiguous region.

2. The integrated circuit device of claim 1, wherein the first contiguous region is at least 0.10 μm wide all around the active area.

3. The integrated circuit device of claim 1, wherein the second contiguous region is at least 0.25 μm wide where the second contiguous region lies between the via and the active area.

4. The integrated circuit device of claim 1, wherein:
    the via and the active area are no more than 35 μm apart.

5. The integrated circuit device of claim 1, wherein the active area is at least 100 μm$^2$.

6. The integrated circuit device of claim 1, wherein the first and second contiguous regions are electrically coupled to ground pads.

7. The integrated circuit device of claim 6, wherein the first and second contiguous regions are electrically coupled to a same ground pad.

8. The integrated circuit device of claim 6, wherein the first and second contiguous regions are electrically coupled to distinct ground pads.

9. The integrated circuit device of claim 1, wherein the active area is formed within an n-well.

10. A 3D integrated circuit device, comprising:
    first and second semiconductor bodies;
    an active area of the first semiconductor body;
    a via penetrating through the first semiconductor body, the via being outside the active area and forming a connection with a circuit formed in the second semiconductor body;
    a first contiguous region throughout which the first semiconductor body is doped p+, the first contiguous region surrounding an area of the semiconductor body, the surrounded area comprising the active area but not the via; and
    a second contiguous region throughout which the first semiconductor body is doped p+, the second region surrounding the via, the second region being disjoint from the first region;
    wherein the second contiguous region encircles the first contiguous region, the semiconductor body is not p-doped or is p-doped to a concentration less than the first and second contiguous regions, and the via is outside the area surrounded by the first contiguous region.

11. The integrated circuit device of claim 10 wherein:
the second contiguous region has a width that varies with position about the via; and
the width of the second contiguous region is at its largest at a location within a space separating the via and the active area.

12. A method of shielding to prevent signals carried by a through-silicon-via from causing noise in an active area of an integrated circuit, comprising:
forming a first p+ guard ring around the through-silicon-via;
forming a second p+ guard ring around the active area; and
grounding the first and second p+ guard rings;
wherein the through silicon via is outside of the area fully surrounded by the first p+ guard ring.

13. The method of claim 12, wherein:
the first p+ guard ring operates as a first ground having a first noise characteristic; and
the second p+ guard ring operates as a second ground having a second noise characteristic, wherein the first noise characteristic is different from the second noise characteristic.

14. The method of claim 12, wherein the first and second p+ guard rings reduce a noise coupling coefficient between the through-silicon-via and the active area at 3 GHz circuit operating frequency to −60 dB or less.

15. The method of claim 12, wherein the second p+ guard ring comprises a width of at least 0.25 μm between the through-silicon-via and the active area.

16. The method of claim 12, wherein the second p+ guard ring encircles the first p+ guard ring.

17. The method of claim 12, wherein:
the through-silicon-via and the active area are no more than 50 μm apart; and
the first and second p+ guard rings reduce the noise coupling coefficient at 3 GHz between the through-silicon-via and the active area to −60 dB or less.

18. The method of claim 12, wherein the active area is at least 100 μm$^2$.

19. An integrated circuit device, comprising:
a semiconductor body;
a through silicon via penetrating through the semiconductor body;
a first guard ring surrounding the through silicon via and being doped to a first concentration, which is less than a second concentration of the semiconductor body;
an active area disposed within the semiconductor body and being spaced and apart from both the first guard ring and the through silicon via; and
a second guard ring surrounding the active area and being disjoint from the first guard ring, the second guard ring being doped to the first concentration;
wherein the first guard ring fully surrounds the second guard ring.

20. The integrated circuit device of claim 19, wherein the first and second guard rings surround mutually exclusive areas of the semiconductor body.

21. The integrated circuit device of claim 19, wherein the first guard ring includes an extension that divides a total area encompassed by the first guard ring into first and second mutually exclusive sub-areas, wherein the first sub-area surrounds the through silicon via and wherein the second sub-area surrounds both the second guard ring and the active area.

22. The integrated circuit device of claim 21, wherein the first sub-area is smaller than the second sub-area.

* * * * *